United States Patent
Kumar Koyithitta Meethal et al.

(10) Patent No.: US 12,078,692 B2
(45) Date of Patent: Sep. 3, 2024

(54) APPARATUS AND METHOD FOR VISUALIZING DEFECTS USING A MAGNETO-OPTICAL EFFECT

(71) Applicant: General Electric Company, Schenectady, NY (US)

(72) Inventors: Manoj Kumar Koyithitta Meethal, Bangalore (IN); Vikram Melapudi, Bangalore (IN); Aparna Chakrapani Sheila-Vadde, Bangalore (IN); Satya Mohan Vamsi Andalam, Bangalore (IN)

(73) Assignee: General Electric Company, Cincinnati, OH (US)

( * ) Notice: Subject to any disclaimer, the term of this patent is extended or adjusted under 35 U.S.C. 154(b) by 31 days.

(21) Appl. No.: 17/967,090

(22) Filed: Oct. 17, 2022

(65) Prior Publication Data

US 2024/0027546 A1 Jan. 25, 2024

(30) Foreign Application Priority Data

Jul. 20, 2022 (IN) .............................. 202211041549

(51) Int. Cl.
*G01R 33/032* (2006.01)
*G01R 33/34* (2006.01)

(52) U.S. Cl.
CPC ..... *G01R 33/032* (2013.01); *G01R 33/34084* (2013.01)

(58) Field of Classification Search
CPC .......................... G01R 33/032; G01R 33/34084
See application file for complete search history.

(56) References Cited

U.S. PATENT DOCUMENTS 3,155,622 A 11/1964 Kazenas
4,625,167 A 11/1986 Fitzpatrick
(Continued)

FOREIGN PATENT DOCUMENTS

GB 2466849 7/2010
JP 2002277842 9/2002
(Continued)

OTHER PUBLICATIONS

Zhang Weipeng, et al. : "Defect imaging curved surface based on flexible eddy current array sensor", Measurement, Institute of Measurement and Control. London, GB, vol. 151, Nov. 20, 2019 (Nov. 20, 2019), XP 085934753, ISSN: 0263-2241, DOI: 10.1016/J.Measurement. 2019. 107280.
(Continued)

*Primary Examiner* — Jay Patidar
(74) *Attorney, Agent, or Firm* — Fitch, Even, Tabin & Flannery, LLP

(57) ABSTRACT

A magneto-optic imaging apparatus adapted for use with an imaging device, such as a smartphone, tablet computer, or borescope, for visually detecting defects in the surface or subsurface of a component using a magneto-optic effect. The magneto-optic imaging apparatus includes a housing with an interface for connection with the imaging device such that a camera and light source of the imaging device may be implemented for magneto-optic visualization. The housing includes optical elements including one or more filters, a polarizer, a magneto-optic or garnet film, and an analyzer. The housing also includes a flexible coil or electrical terminals for inducing a magnetic field in the component. The magneto-optic imaging apparatus may include a translucent or transparent body of conformable material or materials to conform the magneto-optic film and flexible coil to a non-planar surface of the component.

20 Claims, 5 Drawing Sheets

(56) References Cited

U.S. PATENT DOCUMENTS

| | | | |
|---|---|---|---|
| 5,053,704 A | 10/1991 | Fitzpatrick | |
| 5,319,693 A | 6/1994 | Eberhard | |
| 5,754,044 A | 5/1998 | Tanielian | |
| 5,841,277 A * | 11/1998 | Hedengren | G01N 27/902 324/237 |
| 6,745,942 B1 * | 6/2004 | Schramm | G06K 7/087 359/484.01 |
| 10,126,377 B2 | 11/2018 | Hahn | |
| 10,440,332 B2 | 10/2019 | Olsson | |
| 10,648,937 B2 | 5/2020 | Baucke | |
| 2006/0146328 A1 * | 7/2006 | Decitre | G01N 21/21 356/369 |
| 2014/0067185 A1 * | 3/2014 | Tralshawala | G01N 27/90 378/58 |
| 2014/0176698 A1 * | 6/2014 | Banerjee | G01N 27/82 348/92 |
| 2015/0057952 A1 | 2/2015 | Coombs | |
| 2015/0300199 A1 | 10/2015 | Rosenkrans | |
| 2019/0339165 A1 | 11/2019 | Finn | |
| 2021/0233229 A1 | 7/2021 | Hyatt | |

FOREIGN PATENT DOCUMENTS

| | | |
|---|---|---|
| RU | 2753839 C1 * | 8/2021 |
| WO | 2010138093 | 12/2010 |

OTHER PUBLICATIONS

"MOI Magneto-Optic Imaging Systems" brochure, Qi2/Quest Integrated, LLC, Retrieved Jun. 21, 2022 (4 pages).

Lee et al., "Application of Megneto-Optical Method for Inspection of the Internal Surface of a Tube," Electromagnetic Non-Destructive Evaluation II, Proceedings of the 3rd International Workshop on E-NDE, 1997 (6 pages).

Thome, "Development of an Improved Magneto-Optic/Eddy-Current Imager" final report for the U.S Department of Transportation, Federal Aviation Administration, 1998 (54 pages).

* cited by examiner

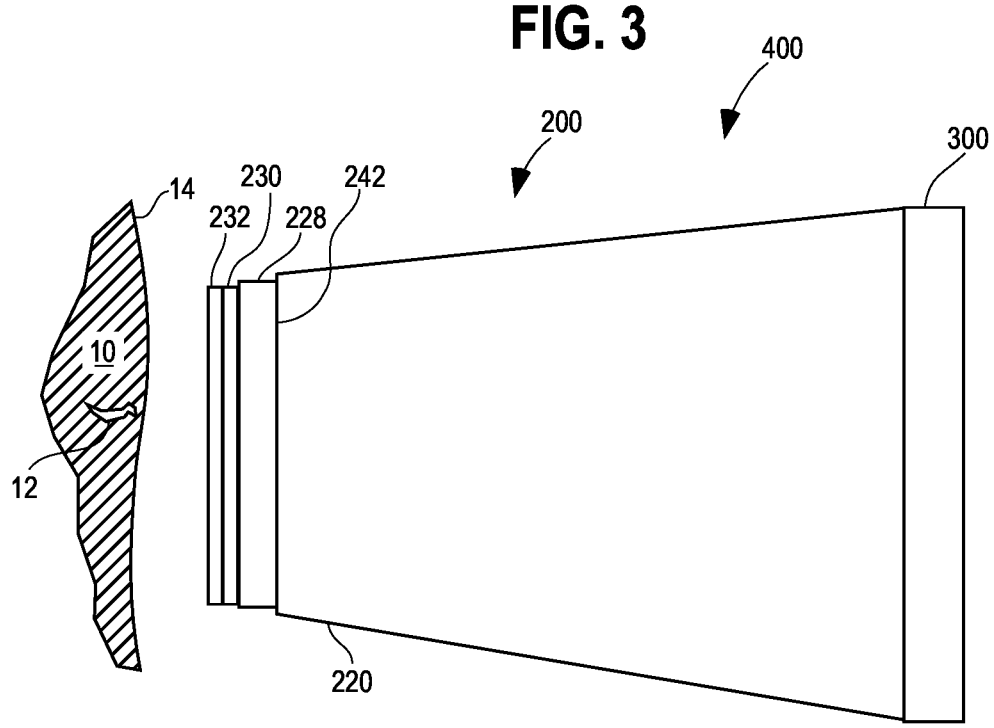
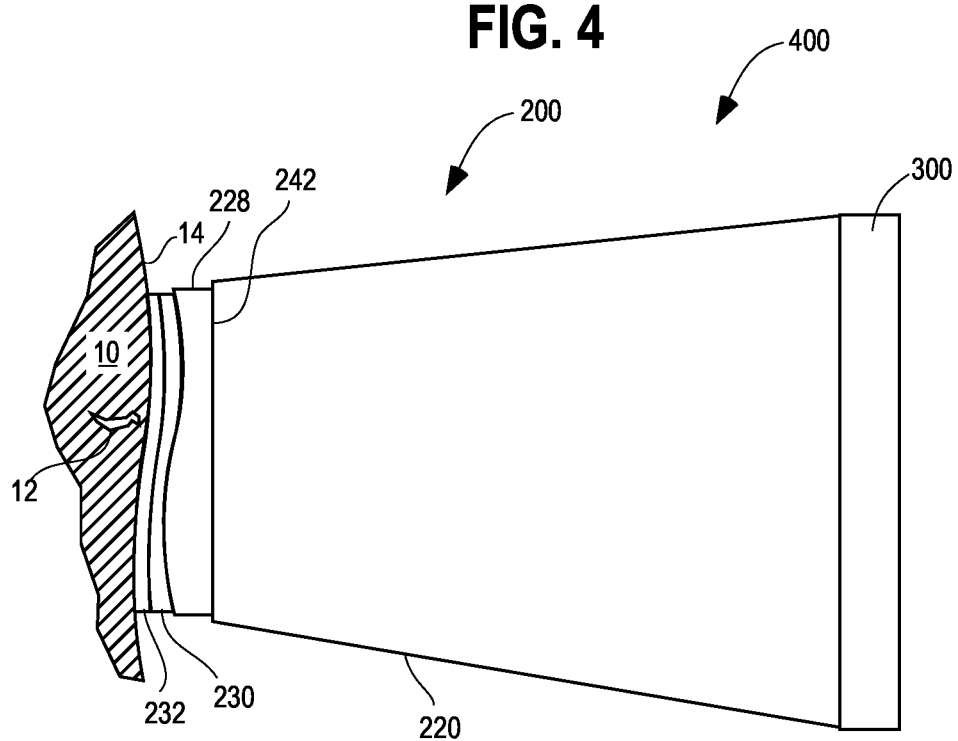

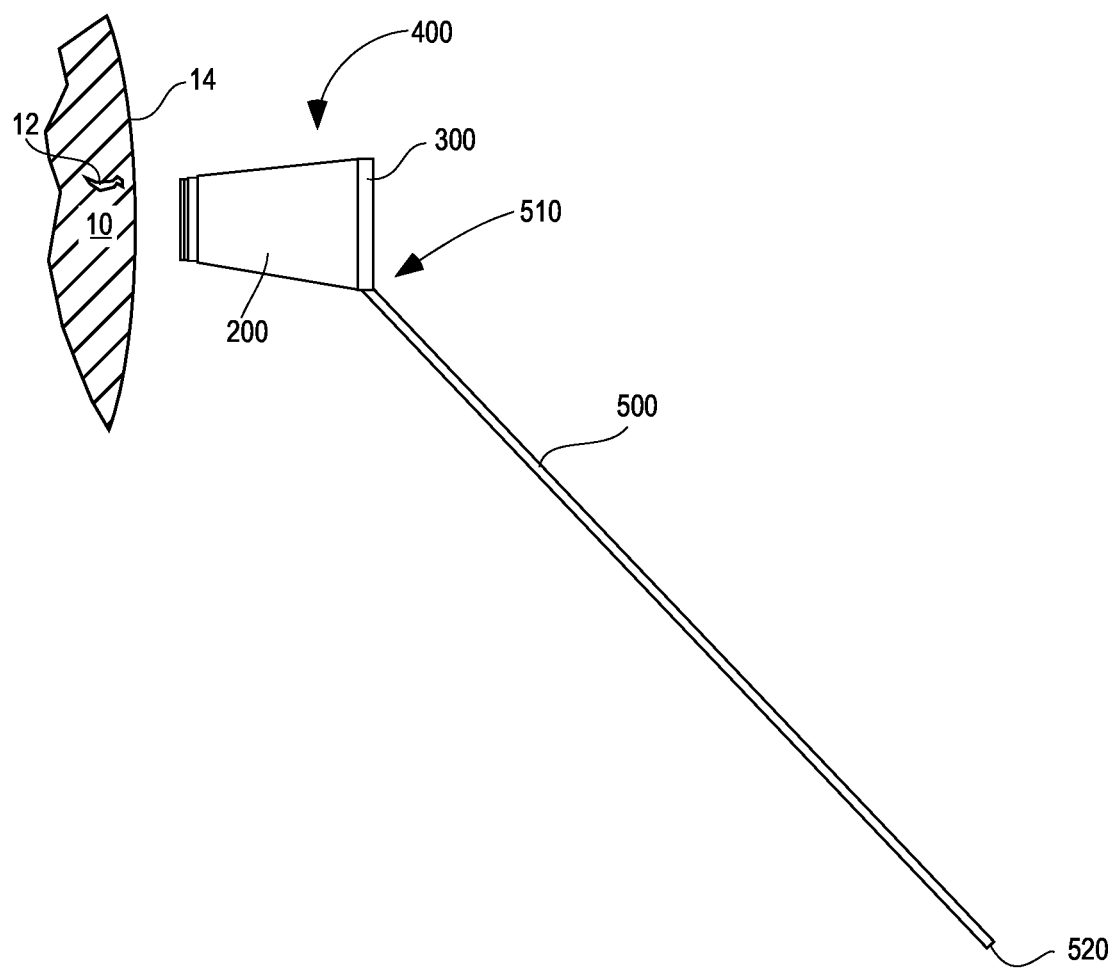

FIG. 6
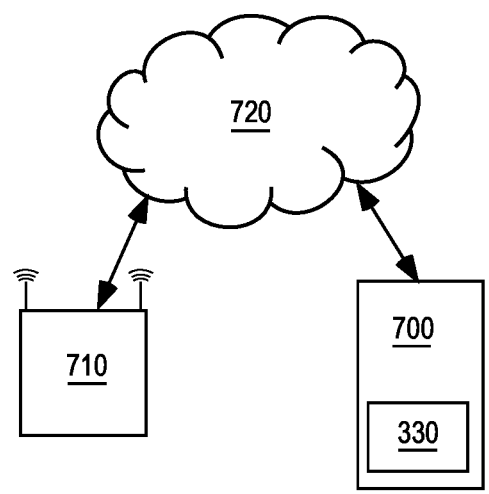
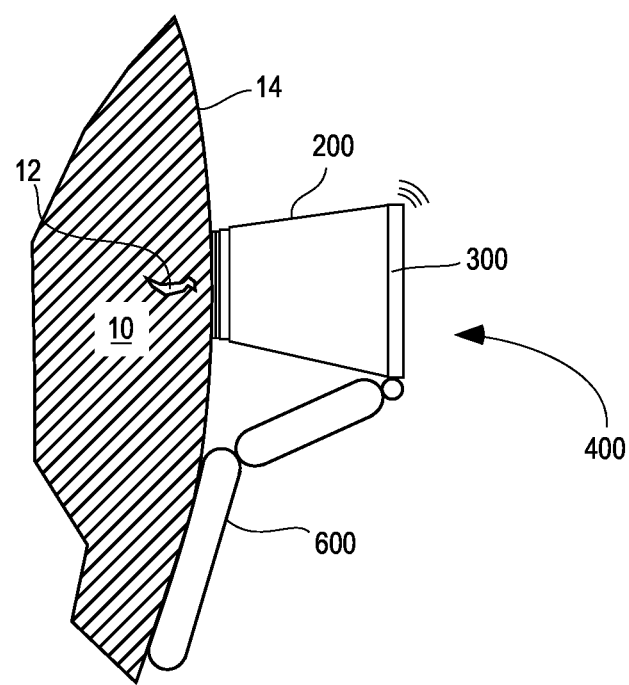

APPARATUS AND METHOD FOR VISUALIZING DEFECTS USING A MAGNETO-OPTICAL EFFECT

RELATED APPLICATIONS

This application claims priority from Indian Patent Application Number IN 202211041549 filed Jul. 20, 2022, which is hereby incorporated herein by reference in its entirety.

TECHNICAL FIELD

These teachings relate generally to apparatuses, systems and methods for detecting defects and discontinuities, such as cracks, in materials, such as airplane components, and more particularly to visualizing defects using magneto-optic visualization with an imaging device.

BACKGROUND

In many applications, near surface cracks, voids, discontinuities, flaws, and defects in ferrous or nonferrous materials must be detected in order to ensure the structural integrity of a material. For example, the material integrity of components comprising many air and space vehicles is critical for their proper operation, especially with regard to components subjected to high stresses, such as turbine and fan blades.

A number of non-destructive testing techniques are utilized to detect cracks, flaws, defects or the like in materials. For example, fluorescent penetrant inspection (FPI) can be used to visualize defects that are in communication with the surface of a material. However, FPI is unable to detect internal defects in a material that lack an opening to the surface of a material.

There is a need for simple, flexible, and effective system for visualizing defects in a material.

BRIEF DESCRIPTION OF THE DRAWINGS

Various needs are at least partially met through provision of the magneto-optic defect visualization system described in the following detailed description, particularly when studied in conjunction with the drawings. A full and enabling disclosure of the aspects of the present description, including the best mode thereof, directed to one of ordinary skill in the art, is set forth in the specification, which refers to the appended figures, in which:

FIG. 3 is a side elevational view of the magneto-optic defect visualization system of FIG. 2 adjacent to a non-planar component;

FIG. 4 is a side elevational view of the magneto-optic defect visualization system of FIG. 2 in conforming contact with the non-planar component;

FIG. 5 is a side elevational view of another embodiment of a magneto-optic defect visualization system attached to an arm for being brought into contact with a remote component; and FIG. 6 is a side elevational view of another embodiment of the magneto-optic defect visualization system in combination with a crawler device for visualizing defects in a component remote from a user.

Figure 1:
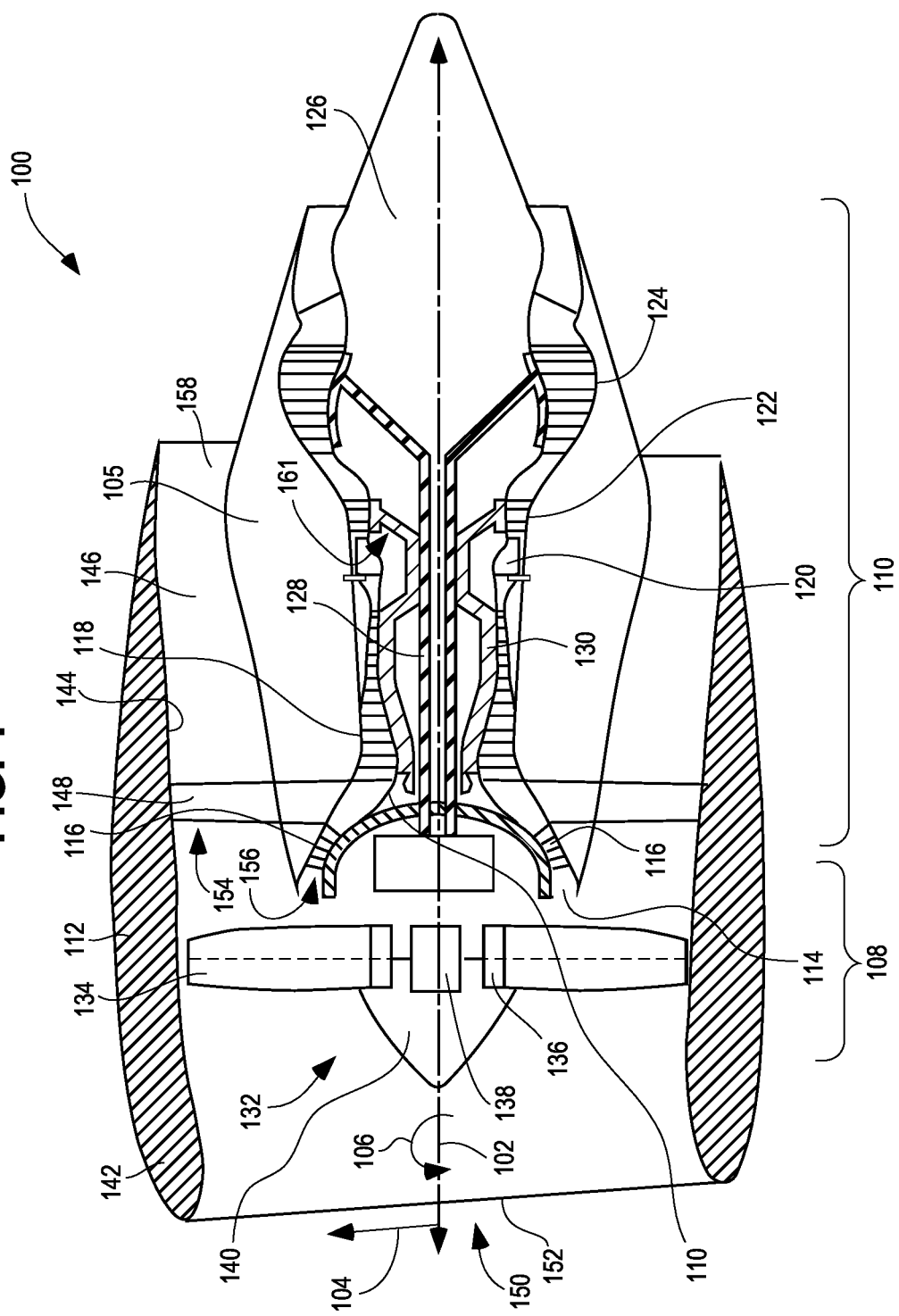
FIG. 1 is a cross-sectional view of a gas turbine engine.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present teachings. Also, common but well-understood elements that are useful or necessary in a commercially feasible embodiment are often not depicted in order to facilitate a less obstructed view of these various embodiments of the present teachings. Certain actions and/or steps may be described or depicted in a particular order of occurrence while those skilled in the art will understand that such specificity with respect to sequence is not actually required.

DETAILED DESCRIPTION

One method utilized to detect defects or cracks in materials is the "eddy current" technique. Eddy current techniques typically utilize a time varying electromagnetic field which is applied to the target material. Non-contact coils may then be used to excite eddy currents in the target material, such that these currents tend to flow around defects and result in field distortions which allow the defect to be detected in a number of ways. For example, circuit parameters characterizing the mutual interaction between the exciting coil and the responding material may comprise the parameters of capacitance, inductance, or reactance. However, conventional eddy current techniques require a considerable amount of support equipment and most techniques do not result in a defect image but rather produce data from which defect information can be obtained only after appropriate analysis has been completed. Further, conventional eddy current techniques are considerably impacted by lift-off variations and surface anomalies.

The following embodiments illustrate magneto-optic visualization apparatuses and systems that allow for visualization of defects in materials using existing imaging devices, such as smartphones, tablet computers, and borescopes. The apparatuses and systems also allow for improved visualization of defects in components with non-planar surfaces, through provision of one or more flexible and/or conformable optical elements and a flexible coil for inducing a magnetic field in the component. The magneto-optic visualization systems may advantageously be combined with other devices such as arms to extend the reach of a user to visualize defects in difficult to reach places. In addition, the magneto-optic visualization systems may be implemented with a crawling robot to allow for magnet-optic visualization and/or scanning of remote or difficult to access locations. The magneto-optic visualization system may also be configured to transmit magneto-optically derived images or video to a computing device and/or display so that the images or video may be viewed by a remote user or processed and stored by a remote computing system.

The terms and expressions used herein have the ordinary technical meaning as is accorded to such terms and expressions by persons skilled in the technical field as set forth above except where different specific meanings have otherwise been set forth herein. The word "or" when used herein shall be interpreted as having a disjunctive construction rather than a conjunctive construction unless otherwise specifically indicated. The terms "coupled," "fixed," "attached to," and the like refer to both direct coupling, fixing, or attaching, as well as indirect coupling, fixing, or attaching through one or more intermediate components or features, unless otherwise specified herein.

The singular forms "a", "an", and "the" include plural references unless the context clearly dictates otherwise.

Approximating language, as used herein throughout the specification and claims, is applied to modify any quantitative representation that could permissibly vary without resulting in a change in the basic function to which it is related. Accordingly, a value modified by a term or terms such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 10 percent margin.

The foregoing and other benefits may become clearer upon making a thorough review and study of the following detailed description. Referring now to the drawings, and in particular to FIG. 1, there is illustrated an exemplary gas turbine engine 100. The gas turbine engine 100 defines an axial direction 102, a radial direction 104, and a circumferential direction 106 (i.e., a direction extending about the axial direction 102). The gas turbine engine 100 includes an outer casing 112 about a fan section 108 followed by a core section 110. The core section 110 includes an inner casing 105 that may be substantially tubular and that defines an annular inlet 114. The inner casing 105 encases, in the axial direction 102, a compressor section including a low-pressure compressor (LPC) 116 and a high-pressure compressor (HPC) 118, a combustion section 120, a turbine section including a high-pressure turbine (HPT) 122 and a low-pressure turbine (LPT) 124, and a jet exhaust nozzle section 126. A low pressure (LP) shaft 128 drivingly connects the LPC 116 to the LPT 124. A high pressure (HP) shaft 130 drivingly connects the HPC 118 to the 122 HPT.

The fan section 108 includes a fan 132 having a plurality of fan blades 134 extending in the radial direction 104 from a disc 136. The LPT 124 drives rotation of the fan 132. More specifically, the fan blades 134, the disc 136, and an actuation member 138 are rotatable together in the circumferential direction 106 by LP shaft 128 in a "direct drive" configuration. Accordingly, the LPT 124 rotates the fan 132 at the same rotational speed of the LPT 124.

A rotatable front hub 140 covers the disc 136 and is aerodynamically contoured to promote an airflow through the plurality of fan blades 134. Additionally, the fan section 108 includes an outer nacelle 142 that circumferentially surrounds the fan section 108 and a portion of the core section 110. More specifically, the nacelle 142 includes an inner wall 144 with a section that extends over the core section 110 to define a bypass airflow passage 146 therebetween. Additionally, the nacelle 142 is supported relative to the core section 110 by a plurality of circumferentially spaced struts 148 that extend in the radial direction 104 and are shaped as guide vanes.

During operation of the gas turbine engine 100, a volume of air 150 enters the gas turbine engine 100 through an associated inlet 152 of the nacelle 142. As the volume of air 150 passes the fan blades 134, a first portion of the air 154 flows into the bypass airflow passage 146, and a second portion of the air 156 flows into the LPC 116. The pressure of the second portion of air 156 is then increased as it flows through the HPC 118 and into the combustion section 120, where it is mixed with fuel and burned to provide combustion gases 161.

The combustion gases 161 flow through the HPT 122 where a portion of thermal and/or kinetic energy from the combustion gases 161 is extracted via sequential stages of HPT stator vanes that are coupled to an inner casing 105 and HPT rotor blades that are coupled to the HP shaft 130, thus causing the HP shaft 130 to rotate, which causes operation of the HPC 118. The combustion gases 161 then flow through the LPT 124 where a second portion of thermal and kinetic energy is extracted from the combustion gases 161 via sequential stages of LPT stator vanes that are coupled to the inner casing 105 and LPT rotor blades that are coupled to the LP shaft 128, thus causing the LP shaft 128 to rotate, which causes operation of the LPC 124 and/or the fan 132.

The combustion gases 161 subsequently flow through the jet exhaust nozzle section 126 to provide propulsive thrust. Simultaneously, the pressure of the first portion of air 154 is substantially increased as the first portion of air 154 flows through the bypass airflow passage 146 before it is exhausted from a fan nozzle exhaust section 158, also providing propulsive thrust. The HPT 122, the LPT 124, and the jet exhaust nozzle section 126 at least partially define a hot gas path for routing the combustion gases 161 through core section 110.

It should be appreciated, however, that the exemplary gas turbine engine 100 depicted in FIG. 1 and described above is by way of example only, and that in other exemplary embodiments, the gas turbine engine 100 may have any other suitable configuration. For example, in other exemplary embodiments, the engine 100 may include any other suitable number of compressors, turbines and/or shaft. Additionally, the gas turbine engine 100 may not include each of the features described herein, or alternatively, may include one or more features not described herein. Additionally, although described as a "turbofan" gas turbine engine, in other embodiments the gas turbine engine may instead be configured as any other suitable ducted gas turbine engine.

Figure 2:
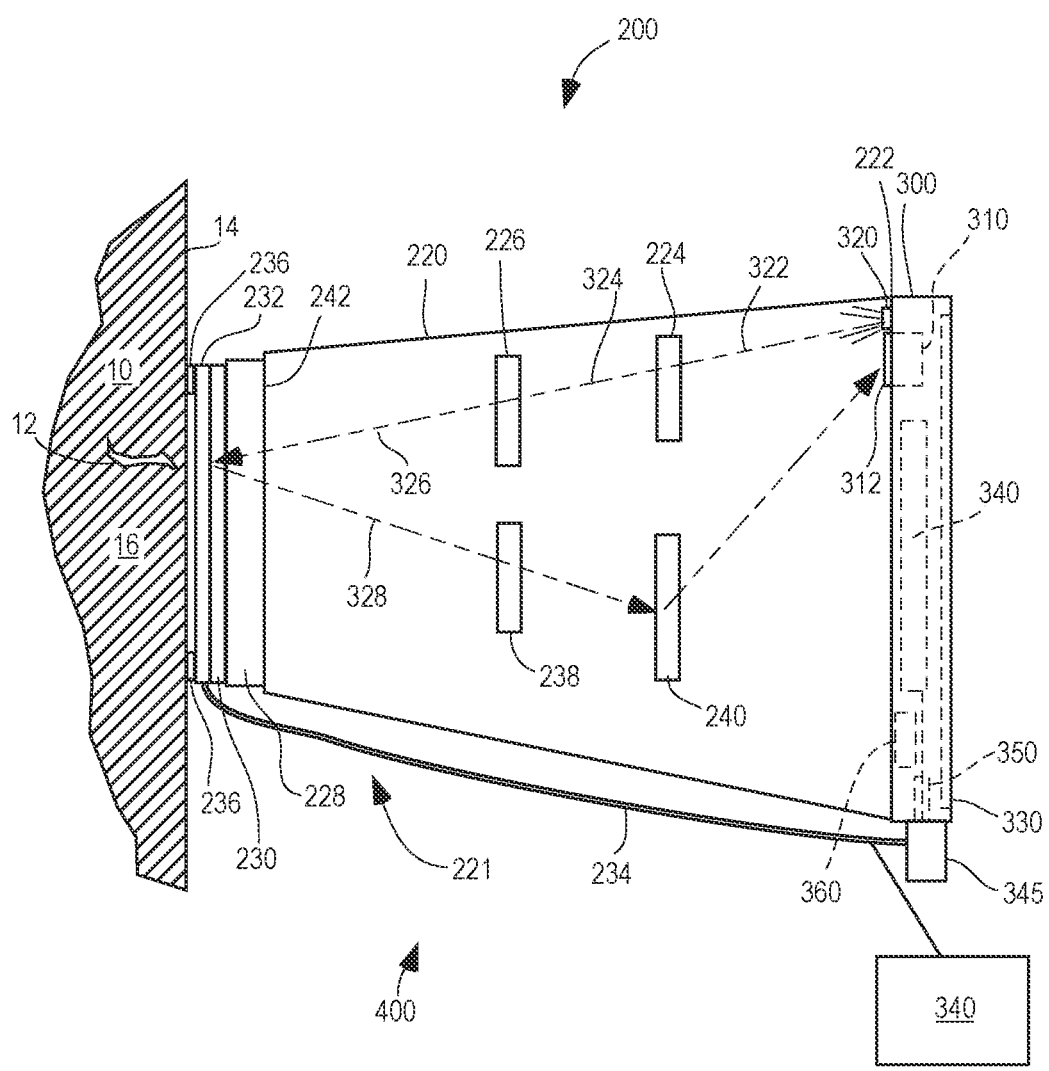
FIG. 2 is side elevational schematic view of a magneto-optic defect visualization system in accordance with one embodiment.

Referring now to FIG. 2, an illustrative magneto-optic defect visualization or imaging apparatus 200 and system 400 that is compatible with many of these teachings will now be presented. A sample component 10 is provided which may include a defect 12, such as a flaw, a crack, or corrosion, within the surface 14 or subsurface 16 of the component 10. The magneto-optic imaging apparatus 200 for visualizing a defect 12 includes a housing 220 which in one form includes an imaging device mounting interface 222 at a proximal end of the housing configured for removably attaching a separate imaging device 300 to the housing 220. A variety of imaging devices 300 may be used together with the housing 220. In general, the imaging device 300 will include a light source 320 and a camera 310, and optionally a display 330, which may be integrated with the imaging device 300 or provided separately. Non-limiting examples of suitable imaging devices 300 include mobile telephones or smartphones, tablet computers, laptop computers, borescopes, cameras, and the like. The imaging device mounting interface 222 may take a variety of forms suitable for securely attaching the imaging device 300 to the housing 220, and may include straps, hooks, a slot or slots, a sleeve, magnets, hook and loop fasteners, threaded fasteners, snaps, clamps, and the like. The imaging device 300 is attached to the imaging device mounting interface 222 with its light source 320 and camera 310 oriented in a distal direction toward the component 10 and a display 330 (if present) facing proximally away from the component 10.

The magneto-optic imaging apparatus 200 is preferably adapted to attach or mount an existing imaging device 300 thereto and advantageously provides the existing imaging device 300 with magneto-optic imaging capabilities. This allows a user to easily conduct magneto-optic imaging of components 10, such as fan blades 134, simply by attaching the magneto-optic imaging apparatus 200 to an imaging device 300 which, in the case of a smartphone, they may already have in their pocket. By using the camera functionality of the imaging device 300, such as a smartphone, images or videos of visualized defects 12 in a component 10 may be easily viewed, stored, and shared, such as via SMS, e-mail, video call, livestream, Bluetooth link, Wi-Fi connection or other known communication methods. Magneto-optically derived images or videos may also be further analyzed by a special purpose application of the imaging device 300 or a remote computing device 700. In another form, the imaging device 300 may be specially designed to be integrated with the housing 220.

The magneto-optic imaging apparatus 200 includes a plurality of optical elements for enabling magneto-optic imaging of a component. One or more white light filters 224 are provided within the housing 220 and optically aligned with the light source 320 for filtering the light 322 emitted by the light source 320 to one or more wavelengths of filtered light 324. A conventional polarizer 226 is provided distal to the filter or filters 224 and in optical alignment therewith for linearly polarizing the filtered light 324 to produce polarized light 326 having a polarization state. At a distal end 221 of the housing 220 opposite from the imaging device mounting interface 222, a distally-oriented face 242 is provided, which includes a flat, transparent, non-conformable surface that allows the polarized light 326 to pass through the face 242.

A translucent or transparent conformable body 228 in optical alignment with the polarizer 226 is attached to the distally-oriented face 242 and is adapted to allow the polarized light 326 to pass therethrough. The conformable body 228 is of a material or combination of materials that are adapted to conform with a non-planar surface of the component 10 when the distal end 221 of the housing 220 is pressed against the component 10, as shown in FIG. 4. For example, the conformable body 228 may be a gel-like material, a solid material, such as a transparent flexible elastomer, such as polydimethylsiloxane, or a fluid or gel-like material encapsulated by a transparent or translucent conformable thin-walled container or a deformable membrane. The fluid contained within the container or membrane of the conformable body 228 may be a gas, such as air, or a liquid, such as water, an oil, or an alcohol. The material or materials of the conformable body 228 may be elastic such that the conformable body 228 has an uncompressed shape and is adapted to resume its uncompressed shape after being compressed. For example, the conformable body 228 may be a fluid-filled flexible membrane which deforms and conforms to a shape of a component 10 when pressed against the component 10 and which resumes its relaxed form when the external pressure is removed.

A conventional magneto-optic or garnet film 230 is attached to or integrated with a distal side of the conformable body 228. The magneto-optic or garnet film 230 is preferably flexible and has maximum sensitivity. A flexible coil 232 is positioned at a distal side of the magneto-optic film 230 and may be attached thereto or to the conformable body 228. The flexible coil 232 preferably has a sheet-like or planar configuration. Both the magneto-optic or garnet film 230 and planar flexible coil 232 are adapted to conform, along with the conformable body 228, to a non-planar surface 14 of a component 10, so that defects or flaws 12 in a wide variety of non-planar components may be visualized.

Instead of a planar flexible coil 232, a pair of spaced-apart electrical terminals 236 may be provided at the distal end of the housing 220 for inducing a current and a resultant magnetic field in the component 10.

The planar flexible coil 232 or electrical terminals 236 are connected via an electrical connection 234 to a current source 340. The current source 340 may be integral to the imaging device 300 or may be provided separately therefrom. For example, an adapter 345 may be used to access the imaging device's 300 host power via an electrical interface 350, such as a bus connection or charging port of the imaging device 300, such that a battery of the imaging device 300 is used to generate the required current in the planar flexible coil 232 or electrical terminals 236. The adapter 345 may also include a DC to AC inverter to convert the current provided by the imaging device 300 from direct to alternating current. In another form, a conventional current source 340 external from the imaging device 300 and the magneto-optic imaging apparatus 200 may be implemented.

The polarized light 326, after passing through the transparent face 242 of the housing 220 and the conformable body 228, is reflected by the magneto-optic or garnet film 230. The reflection causes variations in the polarization state of the polarized light 326, and particularly in the angle of the plane of polarization due to the variations in the magneto-optic film caused by induced magnetic fields. The reflected light 328 then passes through the conformable body 228 and transparent face 242 of the housing 220 again. The reflected light 328 then passes through a conventional analyzer (a second polarizer) 328, which converts the variations in the polarization state of the reflected light 328 (with respect to the polarization state of the polarized light 326 transmitted through the polarizer 226) to variations in light intensity that are visible. The reflected light 328 may be directed towards the camera 310 of the imaging device 300 with one or more reflective surfaces or refractive units 240, such as mirrors or prisms positioned in optical alignment with the analyzer 238.

The reflected light 328 thus provides a visual image of how the magneto-optic film 230 reacts to the induced magnetic fields from eddy-currents in the component surface 14 and subsurface 16. Accordingly, any defects 12 in the component are thereby rendered visible, and can be viewed with a display, such as display 330 of the imaging device 300. If no crack or defect 12 is present in the component surface 14 or subsurface 16, the image seen by the camera 310 is a completely dark or light image. If a crack or defect 12 is present, the image seen by the camera 310 will include contrasting dark or light patterns corresponding to the crack or defect 12.

The camera 310 of the imaging device 300 includes at least a lens 312, an aperture, a sensor, and an image signal processor. The light source 320 of the imaging device 300 in some forms may be a flash associated with the camera 310. In some forms, the light source 320 may be one or more LEDs. In other forms, the light source 320 may comprise an incandescent bulb, a fluorescent lamp, or a laser. The display 330 may take the form of an LCD or LED screen, and may be a touch screen. Remote displays 330 (e.g., see FIG. 6) may include any kind known in the art. The imaging device 300 may include wireless functionality in the form of a wireless module 360 for transmitting data, including image or video data, from the camera 310, to a remote computing device 700, such as a smartphone, tablet computer, computer, remote server, or cloud computing resource, including a display 330 thereof, as shown in FIG. 6.

As shown in FIGS. 3 and 4, the magneto-optic imaging apparatus 200 is adapted to visualize defects 12 in a component 10 with a non-planar surface 14. In particular, when the magneto-optic film 230, flexible coil 232, and conformable body 228 at the distal end 221 of the housing 220 are pressed against the surface 14 of component 10, they are sandwiched between the non-conformable face 242 of the housing 220 and the surface 14 and conform to the shape of the surface 14. This allows the flexible coil 232 and magneto-optic film 230 to be in close and uniform proximity to the surface 14 of the component 10, which improves the induction of a magnetic field into the surface 14 of the component 10 by the flexible coil 232 and improves the visualization of magnetic fields in the magneto-optic film 230.

The magneto-optic imaging apparatus 200 and imaging device 300 may advantageously be connected to other devices for positioning the combined magneto-optic imaging system 400 in position for magneto-optically visualizing defects 12 within a component 10. In one form shown in FIG. 5, the combined magneto-optic imaging system 400 may be attached to a distal end 510 of an elongate arm 500, which may be a rigid or collapsible pole, a selfie stick, a robotic arm, or the like. Accordingly, a user may directly or indirectly manipulate the arm 500 from a proximal end 520 of the arm or from another location remote from the component 10 to position the magneto-optic imaging system 400 in contact with the component and move the magneto-optic imaging system 400 along the surface 14 of the component 10 to detect defects 12 in the component 10.

In another form, the magneto-optic imaging system 400 may be operably connected to a robotic vehicle 600, such as a crawler, as shown in FIG. 6. In each embodiment, images or video acquired from the imaging device 300 may be advantageously transmitted via a wired connection or a wireless communication module 360 of the imaging device 300. The wireless communication module 360, such as a Wi-Fi or cellular module, may be configured to transmit data, including image or video data, via a wireless gateway 710 to a network 720, such as a LAN, WAN, the internet, etc., and on to one or more remote computing devices 700 and displays 330. Similarly, the robotic vehicle 600 and magneto-optic imaging system may be controlled by a user of a remote device 700 via network 720.

Further aspects of the disclosure are provided by the subject matter of the following clauses:

An apparatus for visualizing defects in a component using a magneto-optical effect, including a housing having a proximal interface configured to be removably connected to an imaging device having a camera and a light source, a filter disposed in the housing adapted to filter light from the light source directed therethrough, a polarizer disposed in the housing adapted to polarize the filtered light into polarized light having a polarization state, a transparent or translucent conformable body operably connected to the housing at a distal end thereof and adapted to allow the polarized light to pass therethrough and conform to a non-planar surface of the component, a magneto-optic film operably connected to the transparent or translucent conformable body configured to reflect the polarized light, at least one of a flexible coil operably connected to the magneto-optic film and electrical terminals disposed at a distal end of the housing, wherein the at least one of the flexible coil and the electrical terminals is adapted to induce a magnetic field in the component; and an analyzer disposed in the housing configured to convert variations in a polarization state of the reflected light relative to the polarization state of the polarized light to visible variations in light intensity.

The apparatus of the preceding clause may further include one or more reflective surfaces or refractive units for directing the polarized light reflected by the magneto-optic film to the camera of an attached imaging device.

The apparatus of one or more of the preceding clauses may further include that the transparent or translucent conformable body comprises a fluid encapsulated by a deformable membrane.

The apparatus of one or more of the preceding clauses may further include a current source operably connected to the at least one of the flexible coil and the electrical terminals for applying a current thereto.

The apparatus of one or more of the preceding clauses may further include an electrical connection for connecting the at least one of the flexible coil and the electrical terminals to an electrical interface of the imaging device.

The apparatus of one or more of the preceding clauses may further include that the proximal interface is configured to be operably connected to the imaging device, wherein the imaging device is selected from the group consisting of a smartphone, a tablet computer, and a borescope.

The apparatus of one or more of the preceding clauses may further include that the distal end of the housing includes a distally-oriented face that is non-conformable and configured to allow the polarized light to pass therethrough, and wherein the transparent or translucent conformable body is operably connected to the distally-oriented face.

The apparatus of one or more of the preceding clauses may further include that the transparent or translucent conformable body is of a gel-like material.

The apparatus of one or more of the preceding clauses may further include that the flexible coil has a sheet-like configuration and the transparent or translucent conformable body is adapted to conform the flexible coil and the magneto-optic film to a non-planar surface of the component.

The apparatus of one or more of the preceding clauses may further include an imaging device removably connected to the proximal interface of the housing, the imaging device comprising the light source and the camera.

The apparatus of the preceding clause may include that the imaging device includes a display for displaying an image received by the camera.

The apparatus of one or more of the preceding clauses may further include that the imaging device is one of a smartphone, a tablet computer, and a borescope.

The apparatus of one or more of the preceding clauses may further include an elongate arm having a proximal end and a distal end, wherein the apparatus and the imaging device are operably connected to the distal end for positioning the apparatus and the imaging device adjacent to a surface to be imaged that is remote from the proximal end of the elongate arm.

The apparatus of one or more of the preceding clauses may further include a crawler for positioning the apparatus and the imaging device adjacent to a surface remote from or inaccessible to a user.

The apparatus of one or more of the preceding clauses may further include the at least one of the flexible coil and the electrical terminals are electrically connected to an electrical interface of the imaging device for receiving an electrical current therefrom.

There is further provided a method of detecting defects in a component, the method including attaching an imaging device to an imaging device-mountable magneto-optic imaging apparatus, the imaging device-mountable magneto-optic imaging apparatus including a filter, a polarizer, a magneto-optic film, a flexible coil or electrical contacts, and an analyzer, activating a light source of the imaging device to direct light towards the component through the imaging device-mountable magneto-optic imaging apparatus, inducing a current in the flexible coil or electrical contacts to induce a magnetic field in the component, receiving a magneto-optically derived image of at least a portion of the component with a camera of the imaging device.

The method of the preceding clause may further include that the imaging device is one of a smartphone, a tablet computer, or a borescope.

The method of one or more of the preceding clauses may further include displaying the magneto-optically derived image with a display.

The method of one or more of the preceding clauses may further include transmitting the magneto-optically derived image of the at least a portion of the component to a display remote from the imaging device.

The method of one or more of the preceding clauses may further include conforming a flexible coil and the magneto-optic film of the imaging device-mountable magneto-optic imaging apparatus to a non-planar component.

It will be understood that various changes in the details, materials, and arrangements of parts and components which have been herein described and illustrated to explain the nature of the disclosure may be made by those skilled in the art within the principle and scope of the appended claims. Furthermore, while various features have been described with regard to particular embodiments, it will be appreciated that features described for one embodiment also may be incorporated with the other described embodiments.

What is claimed is:

1. An apparatus for visualizing defects in a component using a magneto-optical effect, comprising:
    a housing having a proximal interface configured to be removably connected to an imaging device having a camera and a light source, wherein the housing comprises a distal end including a distally-oriented external face that comprises a transparent, non-conformable surface;
    a filter disposed in the housing configured to filter light from the light source directed therethrough;
    a polarizer disposed in the housing configured to polarize the filtered light into polarized light having a polarization state;
    a transparent or translucent conformable body operably connected to the distally-oriented external face of the housing and configured to:
        allow the polarized light to pass therethrough; and
        conform to a non-planar surface of the component;
    a magneto-optic film operably connected to a distal side of the transparent or translucent conformable body and configured to reflect the polarized light that passes through the transparent or translucent conformable body, wherein the transparent or translucent conformable body and the magneto-optic film are configured to conform to a non-planar surface of the component;
    at least one of:
        a flexible coil operably connected to the magneto-optic film; and
        electrical terminals disposed at a distal end of the housing, wherein the at least one of the flexible coil and the electrical terminals is configured to induce a magnetic field in the component; and
    an analyzer disposed in the housing configured to convert variations in a polarization state of the reflected light relative to the polarization state of the polarized light to visible variations in light intensity.

2. The apparatus of claim 1, further comprising one or more reflective surfaces or refractive units for directing the polarized light reflected by the magneto-optic film to the camera of an attached imaging device.

3. The apparatus of claim 1, wherein the transparent or translucent conformable body comprises a fluid encapsulated by a deformable membrane.

4. The apparatus of claim 1, further comprising a current source operably connected to the at least one of the flexible coil and the electrical terminals for applying a current thereto.

5. The apparatus of claim 1, further comprising an electrical connection for connecting the at least one of the flexible coil and the electrical terminals to an electrical interface of the imaging device.

6. The apparatus of claim 1, wherein the proximal interface is configured to be operably connected to the imaging device, wherein the imaging device is selected from the group consisting of a smartphone, a tablet computer, and a borescope.

7. The apparatus of claim 1, wherein the distal end of the housing includes a distally-oriented face that is non-conformable and configured to allow the polarized light to pass therethrough, and wherein the transparent or translucent conformable body is operably connected to the distally-oriented face.

8. The apparatus of claim 1, wherein the transparent or translucent conformable body is of a gel-like material.

9. The apparatus of claim 1, wherein the flexible coil has a sheet-like configuration and the transparent or translucent conformable body is configured to conform the flexible coil and the magneto-optic film to a non-planar surface of the component.

10. The apparatus of claim 1, further comprising the imaging device removably connected to the proximal interface of the housing, the imaging device comprising the light source and the camera.

11. The apparatus of claim 10, wherein the imaging device comprises a display for displaying an image received by the camera.

12. The apparatus of claim 10, wherein the imaging device is one of a smartphone, a tablet computer, and a borescope.

13. The apparatus of claim 10, further comprising an elongate arm having a proximal end and a distal end, wherein the apparatus and the imaging device are operably connected to the distal end for positioning the apparatus and the imaging device adjacent to a surface to be imaged that is remote from the proximal end of the elongate arm.

14. The apparatus of claim 10, further comprising a crawler for positioning the apparatus and the imaging device adjacent to a surface remote from or inaccessible to a user.

15. The apparatus of claim 10, wherein the at least one of the flexible coil and the electrical terminals are electrically connected to an electrical interface of the imaging device for receiving an electrical current therefrom.

16. A method of detecting defects in a component, the method comprising:
    attaching an imaging device to an imaging device-mountable magneto-optic imaging apparatus, the imaging device-mountable magneto-optic imaging apparatus including a housing, a filter, a polarizer, a translucent or transparent conformable body mounted to a distally-oriented external face of the housing, a magneto-optic film operably connected to a distal side of the translucent or transparent conformable body, a flexible coil or electrical contacts, and an analyzer;

conforming the translucent or transparent conformable body and the magneto-optic film of the imaging device-mountable magneto-optic imaging apparatus to a non-planar surface of the component;

activating a light source of the imaging device to direct light towards the component through the imaging device-mountable magneto-optic imaging apparatus;

inducing a current in the flexible coil or electrical contacts to induce a magnetic field in the component; and receiving a magneto-optically derived image of at least a portion of the component with a camera of the imaging device.

17. The method of claim 16, wherein the imaging device is one of a smartphone, a tablet computer, or a borescope.

18. The method of claim 16, further comprising displaying the magneto-optically derived image with a display.

19. The method of claim 16, further comprising transmitting the magneto-optically derived image of the at least a portion of the component to a display remote from the imaging device.

20. The method of claim 16, wherein the imaging device-mountable magneto-optic imaging apparatus comprises a flexible coil, the method further comprising conforming the flexible coil, the translucent or transparent conformable body and the magneto-optic film of the imaging device-mountable magneto-optic imaging apparatus to the non-planar surface of the component.

* * * * *